(12) United States Patent  (10) Patent No.: US 8,614,891 B2
Nagano et al.  (45) Date of Patent: Dec. 24, 2013

(54) POWER CONVERTING APPARATUS AND REACTOR

(75) Inventors: Sumiaki Nagano, Fukuoka (JP);
Kazutaka Kishimoto, Kitakyushu (JP);
Makoto Kojyo, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 101 days.

(21) Appl. No.: 13/449,269

(22) Filed: Apr. 17, 2012

(65) Prior Publication Data

US 2012/0262969 A1  Oct. 18, 2012

(30) Foreign Application Priority Data

Apr. 18, 2011 (JP) ................. 2011-091908

(51) Int. Cl.
*H05K 7/20* (2006.01)
(52) U.S. Cl.
USPC ............................. 361/690; 361/694; 361/695
(58) Field of Classification Search
None
See application file for complete search history.

(56) References Cited

U.S. PATENT DOCUMENTS

| 5,583,751 A * | 12/1996 | Nakazawa et al. ............... 363/20 |
| 2011/0068622 A1* | 3/2011 | Ikeno et al. .................. 307/10.1 |
| 2012/0041347 A1* | 2/2012 | Gammons ...................... 601/15 |
| 2012/0262968 A1* | 10/2012 | Nagano et al. ................ 363/141 |

FOREIGN PATENT DOCUMENTS

| JP | 03-078166 U | 8/1991 |
| JP | 2003-004170 | 1/2003 |
| JP | 2009-123635 | 6/2009 |
| JP | 2010-130779 | 6/2010 |
| JP | 2011-028892 | 2/2011 |

OTHER PUBLICATIONS

Japanese Office Action for corresponding JP Application No. 2011-091908, Jul. 25, 2013.
Japanese Office Action for corresponding JP Application No. 2011-091908, May 15, 2013.

* cited by examiner

*Primary Examiner* — Gregory Thompson
(74) *Attorney, Agent, or Firm* — Ditthavong Mori & Steiner, P.C.

(57) ABSTRACT

A power converting apparatus includes a housing, a self-standing cable, and a grommet securing member. The housing includes a housing base, a main body, and an air duct. The housing base includes a through hole. The main body includes a plurality of electronic components on a first surface of the housing base. The air duct is disposed on a second surface of the housing base. The self-standing cable is disposed through the through hole so as to be wired between the main body and the air duct. The self-standing cable stands on itself in a direction approximately orthogonal to the housing base. The grommet securing member is disposed in the air duct or the main body so as to secure a grommet to the through hole. The grommet securing member is not integral with the housing base.

17 Claims, 11 Drawing Sheets

POWER CONVERTING APPARATUS AND REACTOR

CROSS-REFERENCE TO RELATED APPLICATIONS

The present application claims priority under 35 U.S.C. §119 to Japanese Patent Application No. 2011-091908, filed Apr. 18, 2011. The contents of this application are incorporated herein by reference in their entirety.

BACKGROUND OF THE INVENTION

1. Field of the Invention

The present invention relates to a power converting apparatus and a reactor.

2. Discussion of the Background

As disclosed in Japanese Unexamined Patent Publication No. 2003-4170, a conventional waterproof structure of a cable inlet portion includes a grommet entirely formed of rubber and fitted into a through hole on a wall of a structure. A cable passes through the grommet.

SUMMARY OF THE INVENTION

According to one aspect of the present invention, a power converting apparatus is configured to convert alternating current power into direct current power or convert direct current power into alternating current power. The power converting apparatus includes a housing, a self-standing cable, and a grommet securing member. The housing includes a housing base, a main body, and an air duct. The housing base has a first surface and a second surface and includes a through hole. The main body includes a plurality of electronic components on the first surface of the housing base. The air duct is disposed on the second surface of the housing base, and cooling air flows through the air duct. The self-standing cable is disposed through the through hole of the housing base so as to be wired between the main body and the air duct. The self-standing cable stands on itself in a direction approximately orthogonal to the housing base. The grommet securing member is disposed in at least one of the air duct and the main body so as to secure a grommet to the through hole of the housing base. The grommet permits the self-standing cable to be disposed through the grommet. The grommet securing member is not integral with the housing base.

According to another aspect of the present invention, a reactor is disposed in an air duct of a power converting apparatus. The power converting apparatus is configured to convert alternating current power into direct current power or convert direct current power into alternating current power. The power converting apparatus includes a housing including a housing base, a main body, and the air duct. The housing base has a first surface and a second surface and includes a through hole. The main body includes a plurality of electronic components on the first surface of the housing base. The air duct is disposed on the second surface of the housing base, and cooling air flows through the air duct. The reactor includes a self-standing cable including a lead wire for the reactor. The self-standing cable is disposed through the through hole of the housing base so as to be wired between the main body and the air duct. The self-standing cable stands on itself in a direction approximately orthogonal to the housing base.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

Figure 1:
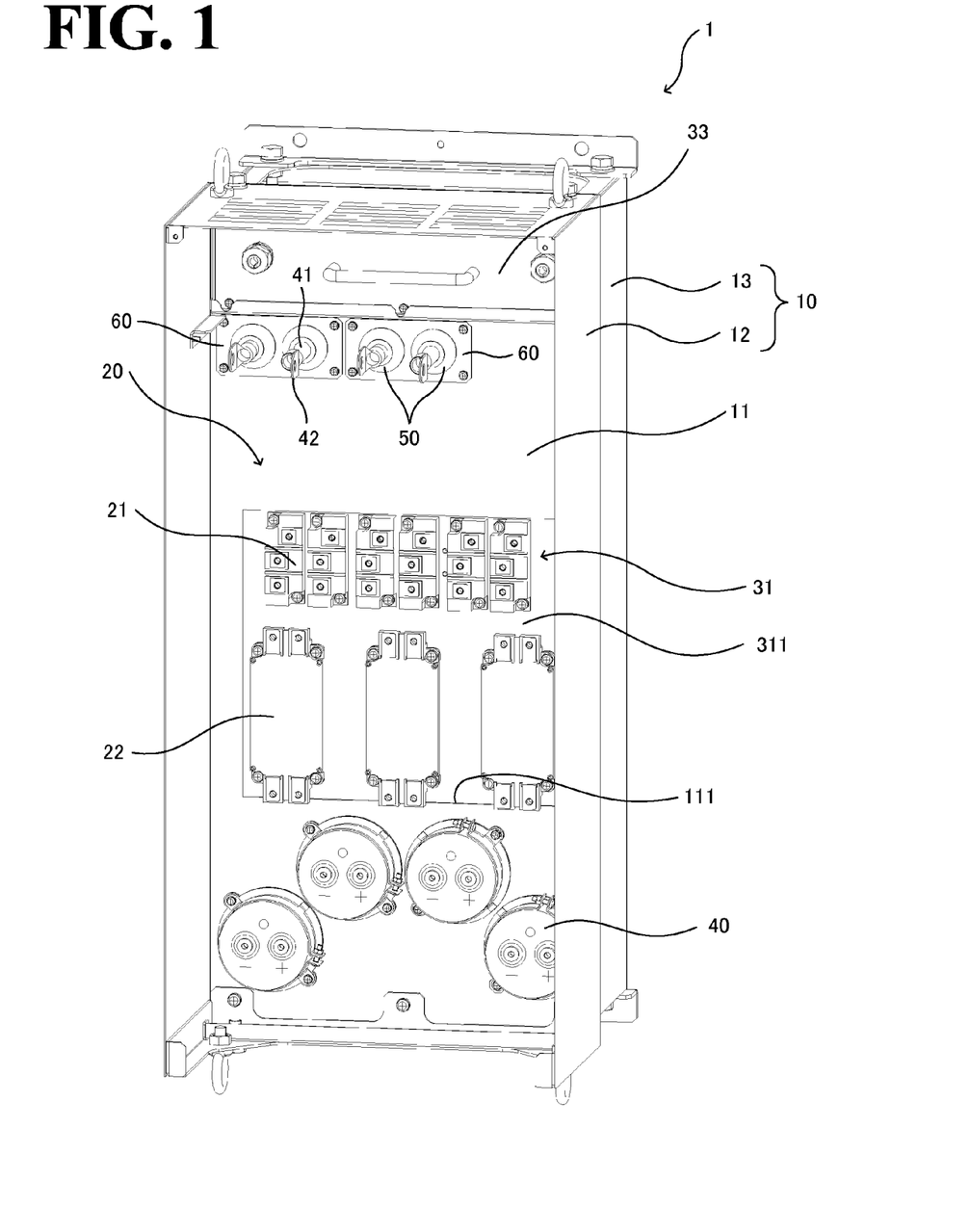
FIG. 1 is a perspective view a power converter according to an embodiment illustrating an internal structure of the power converter on the main body side.
Figure 2:
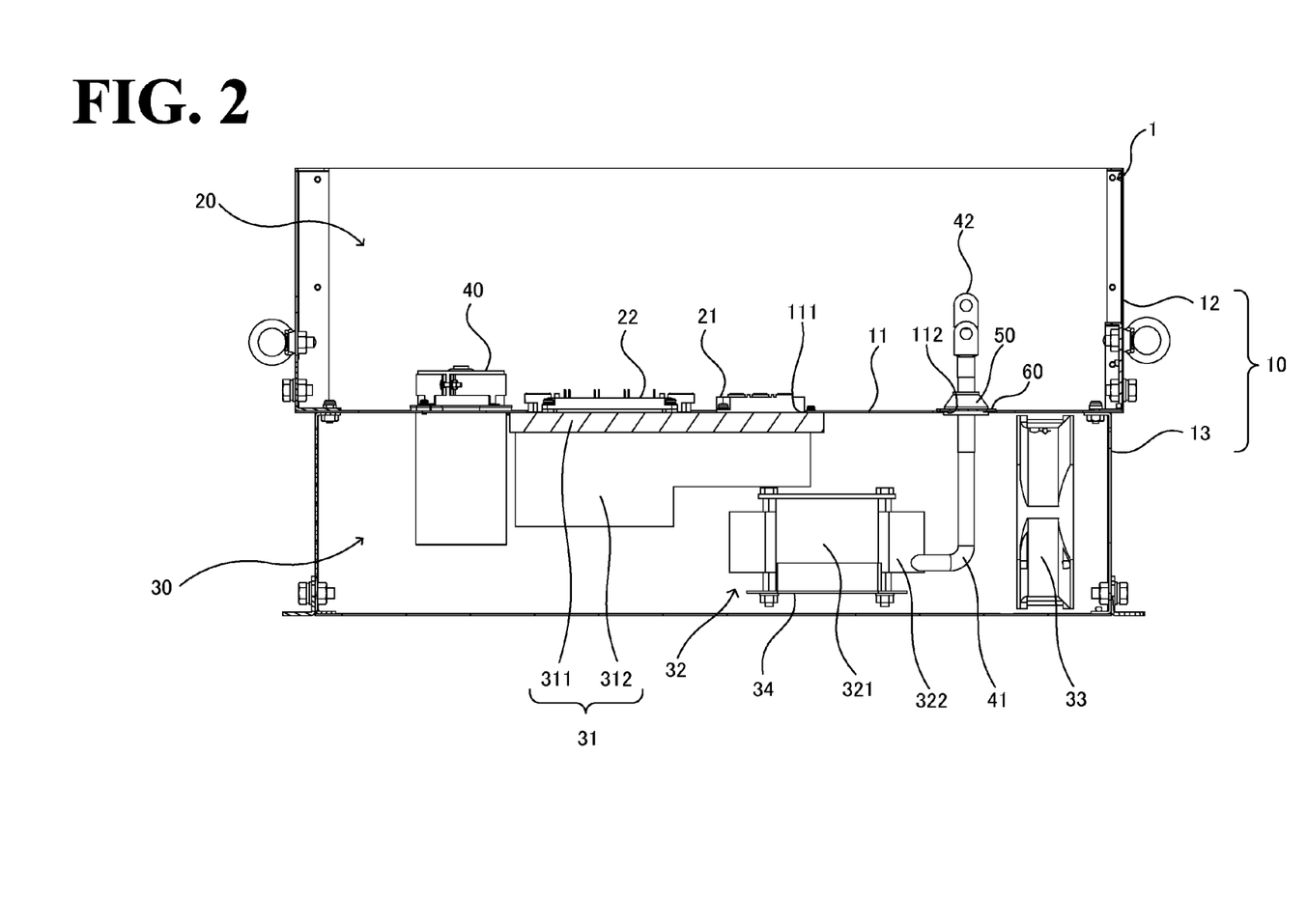
FIG. 2 is a longitudinal sectional view of the power converter according to the embodiment illustrating an internal structure of the power converter on the air duct side.
Figure 3:
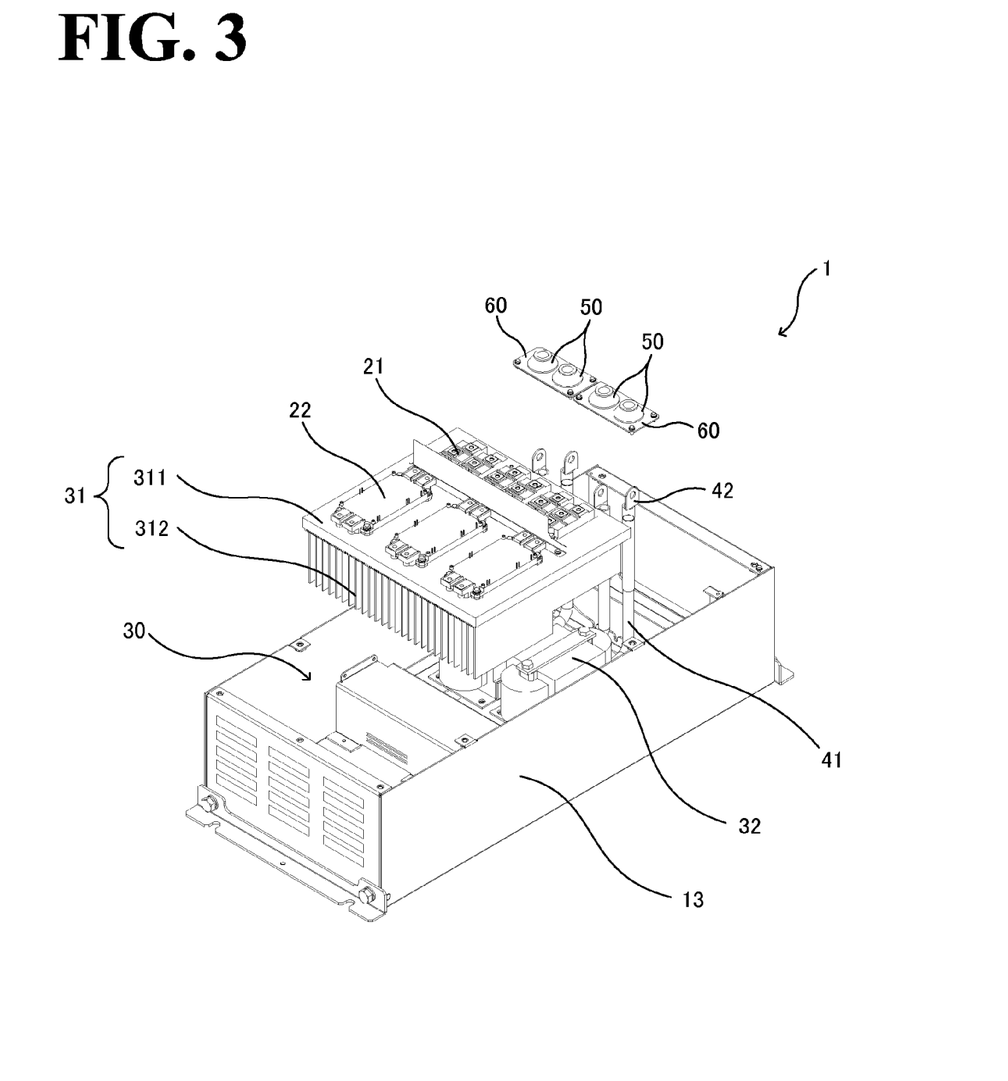
FIG. 3 is a perspective view of the power converter according to the embodiment illustrating an internal structure of the power converter on the air duct side.

As shown in FIGS. 1 to 3, a power converting apparatus 1 according to this embodiment is an inverter device to convert direct current power into alternating current power. The power converting apparatus 1 includes a housing 10, a main body 20, an air duct 30, and cylindrical capacitors 40. The housing 10 includes a housing base 11. The main body 20 is disposed on the front surface of the housing base 11 (in other words, on one surface of the housing base 11, as seen on the front-left side of the paper surface of FIG. 1, and the upper side in FIGS. 2 and 3). The air duct 30 is disposed on the rear surface of the housing base 11 (in other words, on the other surface of the housing base 11, as seen on the rear-right side of the paper surface of FIG. 1, and the lower side in FIGS. 2 and 3). Cooling air flows through the air duct 30. In the following description, the term "width direction" means the width direction of the housing 10 (that is, the right-to-left direction in FIG. 1).

The housing 10 includes a main body housing piece 12 and an air duct housing piece 13. The main body housing piece 12 encloses the main body 20 side, while the air duct housing piece 13 encloses the air duct 30 side. The rear surface of the main body housing piece 12 constitutes the housing base 11, so that the housing base 11 serves as a partition wall to separate the main body 20 and the air duct 30 from one another. In FIG. 3, the illustration of the main body housing piece 12 is omitted.

The main body 20 includes a plurality of electronic components including diode modules 21 and power modules 22. The diode modules 21 and the power modules 22 are tightly secured to the front surface of a base portion 311 of a heat sink 31, described later (in other words, to the surface on the front left side of the paper surface of FIG. 1, and the surface on the upper side in FIGS. 2 and 3). The diode modules 21 rectify alternating current power fed from an alternating current power source, not shown, so as to covert the alternating current power into direct current power and to output the direct current power. The power modules 22 include a plurality of switching elements incorporating semiconductor devices such as IGBTs (Insulated Gate Bipolar Transistors). The plurality of switching elements repeat conductions and shutoffs in respective appropriate orders so as to output alternating current power of predetermined frequencies.

In the air duct 30, the heat sink 31, two reactors 32, and a fan unit 33 are disposed. The two reactors 32 smooth the pulsation of the current of the direct current power converted from the alternating current power. The fan unit 33 generates cooling air. The heat sink 31 is made of a material with high heat conductivity (examples including, but not limited to, an aluminum alloy). The heat sink 31 includes a base portion 311 and a plurality of fins 312. The base portion 311 is mounted to the housing base 11 so as to close an opening 111 of the housing base 11. The plurality of fins 312 are upright on the rear surface of the base portion 311 (in other words, on the surface on the rear-right side of the paper surface of FIG. 1, and the surface on the lower side in FIGS. 2 and 3). In the heat sink 31, the heat of the diode modules 21 and the power modules 22, which are tightly secured to the front surface of the base portion 311, is radiated through the plurality of fins 312. Thus, the diode modules 21 and the power modules 22 are cooled.

The capacitors 40 smooth the direct current power converted from the alternating current power by the diode modules 21. The capacitors 40 penetrate the housing base 11 such that part of each of them is disposed in the main body 20 and the rest of each of them is disposed in the air duct 30. In FIG. 3, the illustration of the capacitors 40 is omitted.

In the power converting apparatus 1, cables 41 serving as lead wires for the reactors 32 pass through a through hole 112 (see FIG. 2 and FIG. 11, which is described later), which is disposed on the housing base 11, so as to be wired between the main body 20 and the air duct 30. The cables 41 are self-standing cables that stand on themselves in the direction approximately orthogonal to the housing base 11. Two cables 41 are wired to each reactor 32, and a total of four cables 41 pass through respective cable insertion grommets 50 at the penetrating portion. Each of the cables 41 has, at its end, a terminal 42. The grommets 50 are secured to the through hole 112 on the housing base 11 by grommet securing members 60 disposed in the main body 20. The grommet securing members 60 are not integral with the housing base 11.

Figure 4:
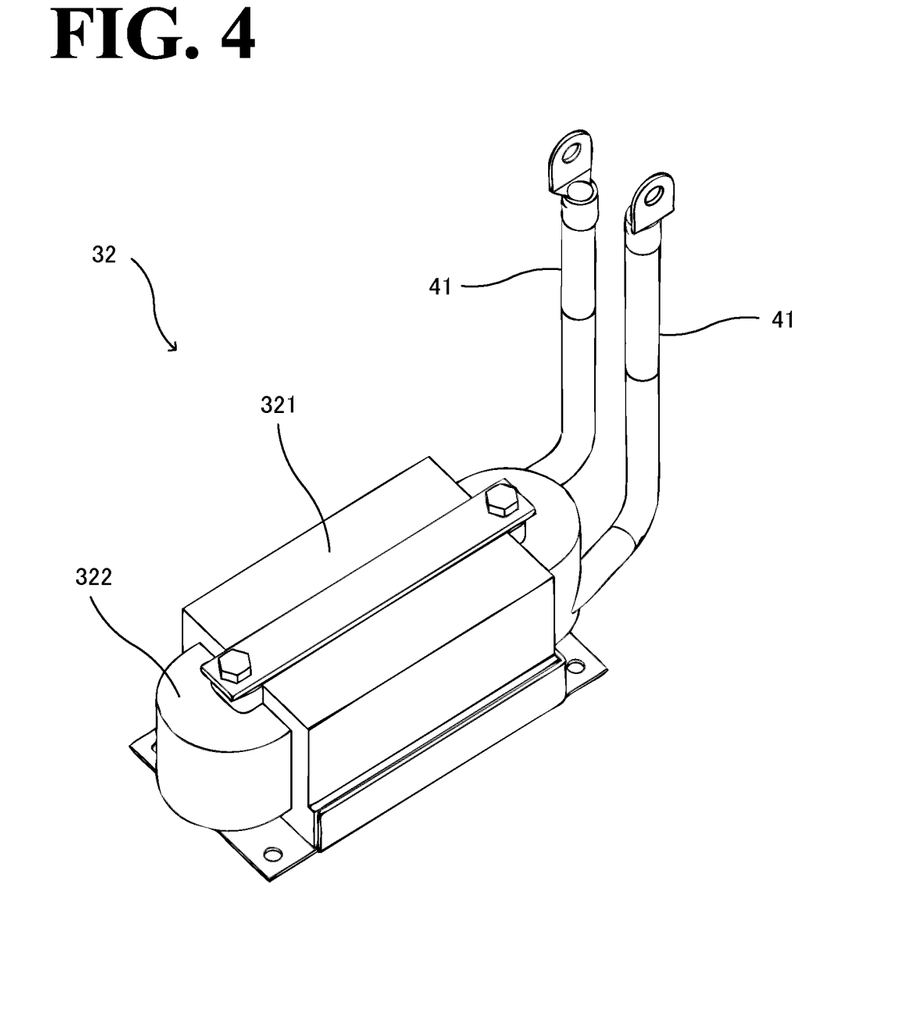
FIG. 4 is a perspective view of a reactor according to the embodiment.

The reactors 32 are disposed on a reactor base 34 (see FIG. 2 and FIG. 8, which is described later) in the air duct 30. As shown in FIGS. 2 and 4, each of the reactors 32 includes a core 321, a coil 322 wound around the core 321, and the cables 41 drawn from the coil 322. The cables 41 have relatively large rigidity so that with the reactors 32 in place, the cables 41 extend from the coil 322 in a direction parallel to the housing base 11, and then bend in the course of the parallel extension such that each cable 41, from the bending portion to the distal end, extends in the direction approximately orthogonal to the housing base 11. This, as a result, makes the cables 41 self-standing cables that stand on themselves in the direction approximately orthogonal to the housing base 11.

Next, the grommet securing member 60 will be described in detail by referring to FIGS. 5 to 7.

Figure 6A:
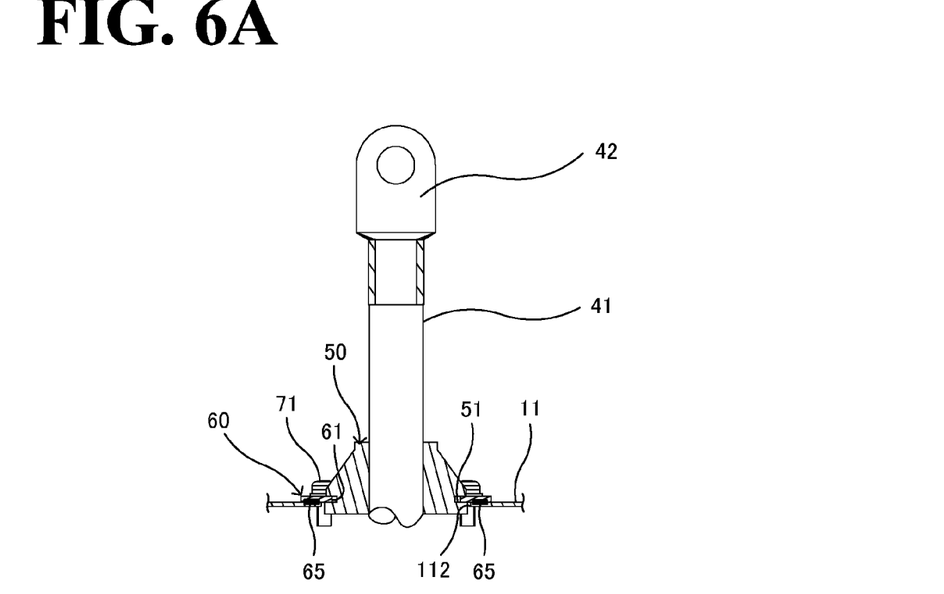
FIG. 6A is a cross sectional view taken along the line VIA-VIA of FIG. 5.
Figure 6B:
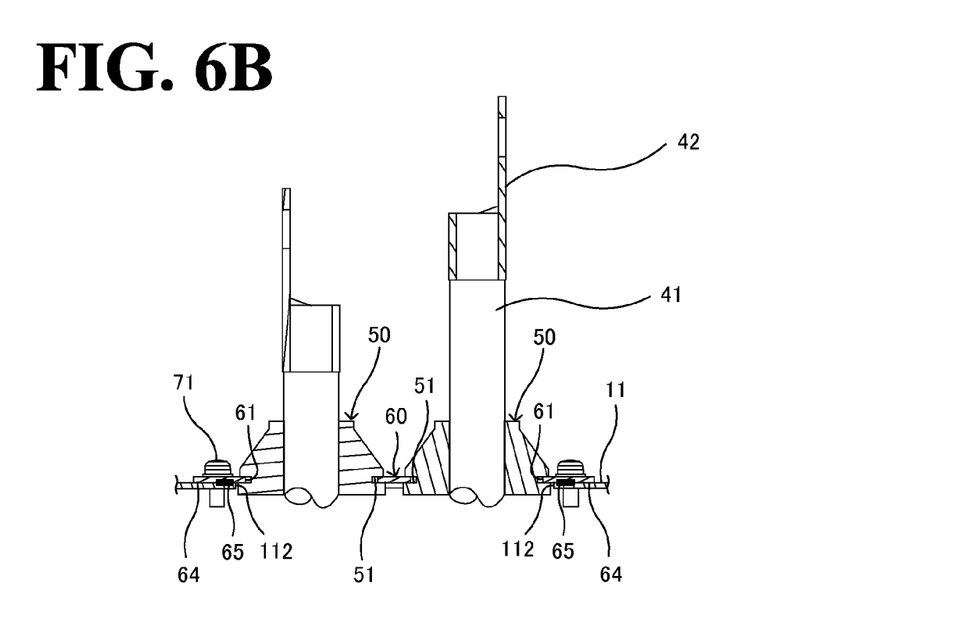
FIG. 6B is a cross sectional view taken along the line VIB-VIB of FIG. 5.
Figure 7:
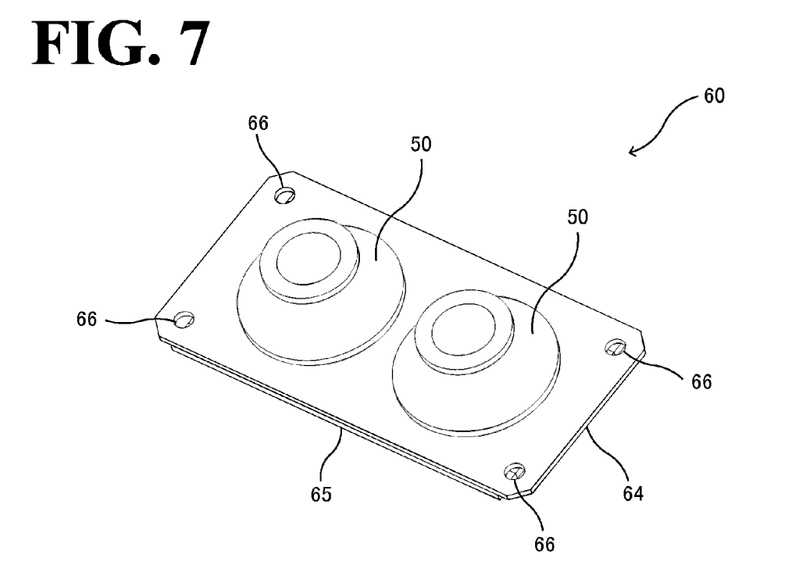
FIG. 7 is a perspective view of a grommet securing member.

As shown in FIG. 7, the grommet securing member 60 is an approximately rectangular, flat plate member that permits two grommets 50 to pass through the grommet securing member 60 so as to hold the two grommets 50. The grommet securing member 60 has an edge portion 64 on the other surface (in other words, the rear-right side of the paper surface of FIG. 7, and the lower side in FIGS. 5, 6A, and 6B). The edge portion 64 is in contact with the circumference of the through hole 112 on the front surface of the housing base 11 (in other words, the upper surface in FIGS. 6A and 6B). A gasket 65 in the form of an approximately square frame is disposed on the edge portion 64.

As shown in FIGS. 6A and 6B, the grommet securing member 60 has through holes 61 for the grommets 50. Each of the through holes 61 has a diameter smaller than the outer diameter of each of the grommets 50. The edge portion of each of the through holes 61 is fitted in a cut-in portion 51 formed on each of the grommets 50, so that the grommets 50 are held by the grommet securing member 60. To facilitate the work of fitting the grommet 50 with the through hole 611, the cut-in portion 51 has a depth with an additional predetermined margin. This ensures that the grommet 50, when fitted with the through hole 61, is movable along the plane of the grommet securing member 60 within the margin.

Figure 5:
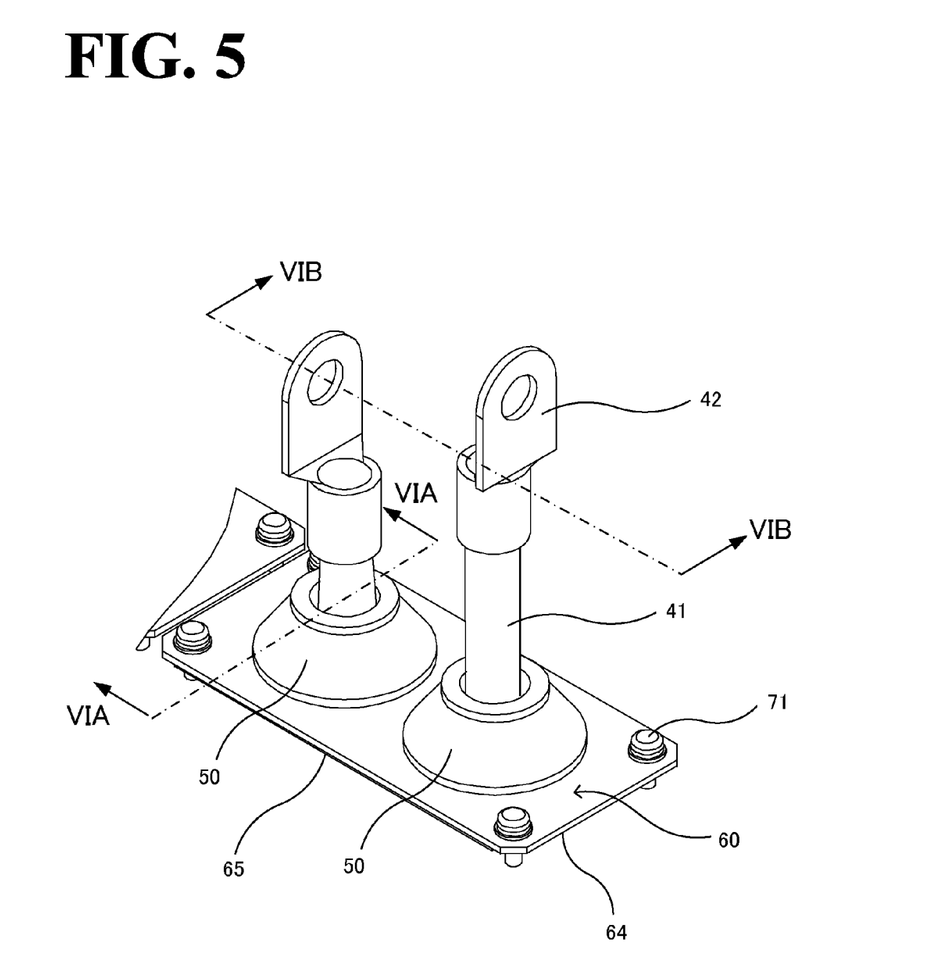
FIG. 5 is an enlarged perspective view of a cable penetrating portion of a housing base.

The grommet securing member 60 includes, on its four corners, insertion holes 66 for securing screws 71 (see FIGS. 5, 6A, and 6B). The housing base 11 includes screw holes (not shown) at positions corresponding to the insertion holes 66. The securing screws 71 are inserted through the insertion holes 66 of the grommet securing member 60 from the main body 20 side to be joined to the screw holes of the housing base 11. This ensures that the edge portion 64, which is on the other surface of the grommet securing member 60, is brought into close contact with the front surface of the housing base 11 across the gasket 65, and that the grommet securing member 60 hermetically seals the through hole 112 of the housing base 11. The edge portion 64 corresponds to the close contact portion recited in the claims.

Referring to FIGS. 8 to 12, description will be made with regard to the assembly work of the waterproof structure of the cable penetrating portion in the power converting apparatus 1.

Figure 8:
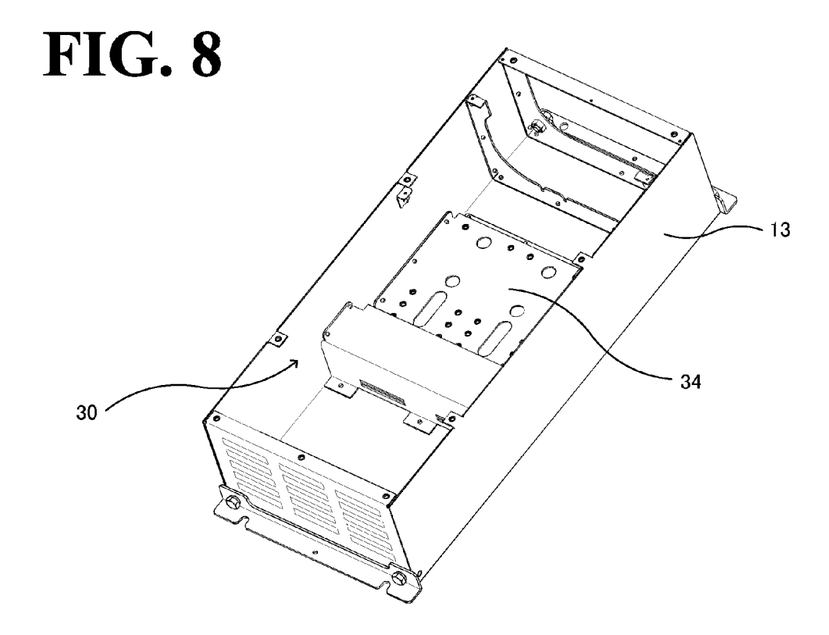
FIG. 8 is a perspective view of an air duct housing piece illustrating its internal structure prior to mounting of reactors.
Figure 9:
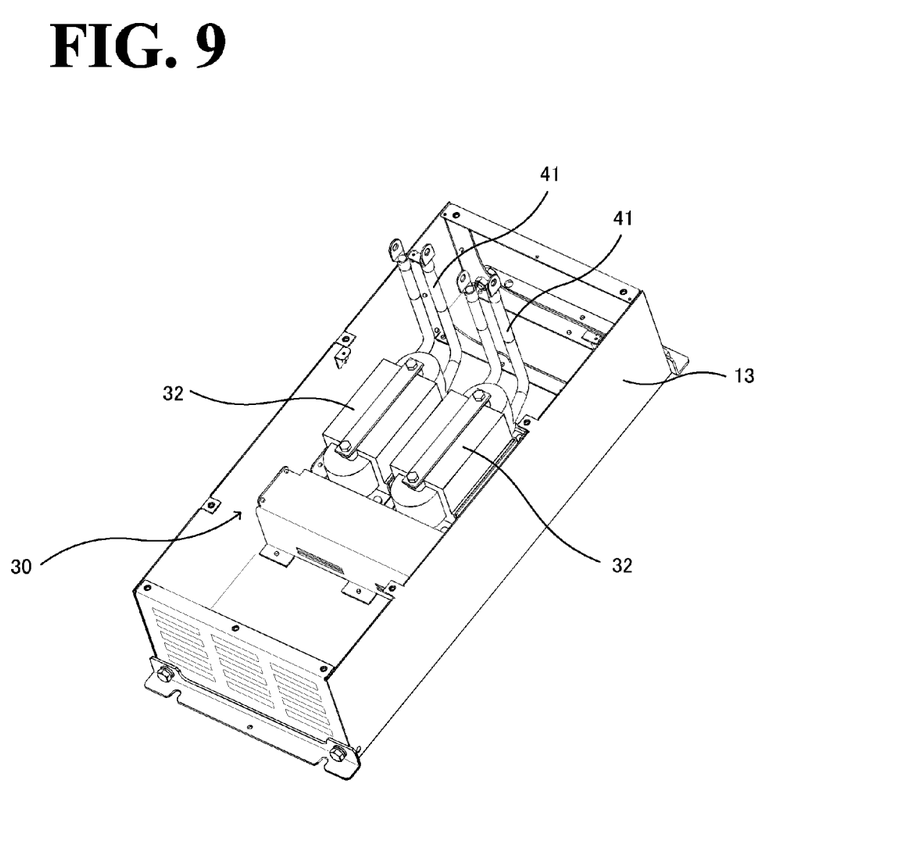
FIG. 9 is a perspective view of the air duct housing piece illustrating its internal structure after mounting of the reactors.
Figure 10:
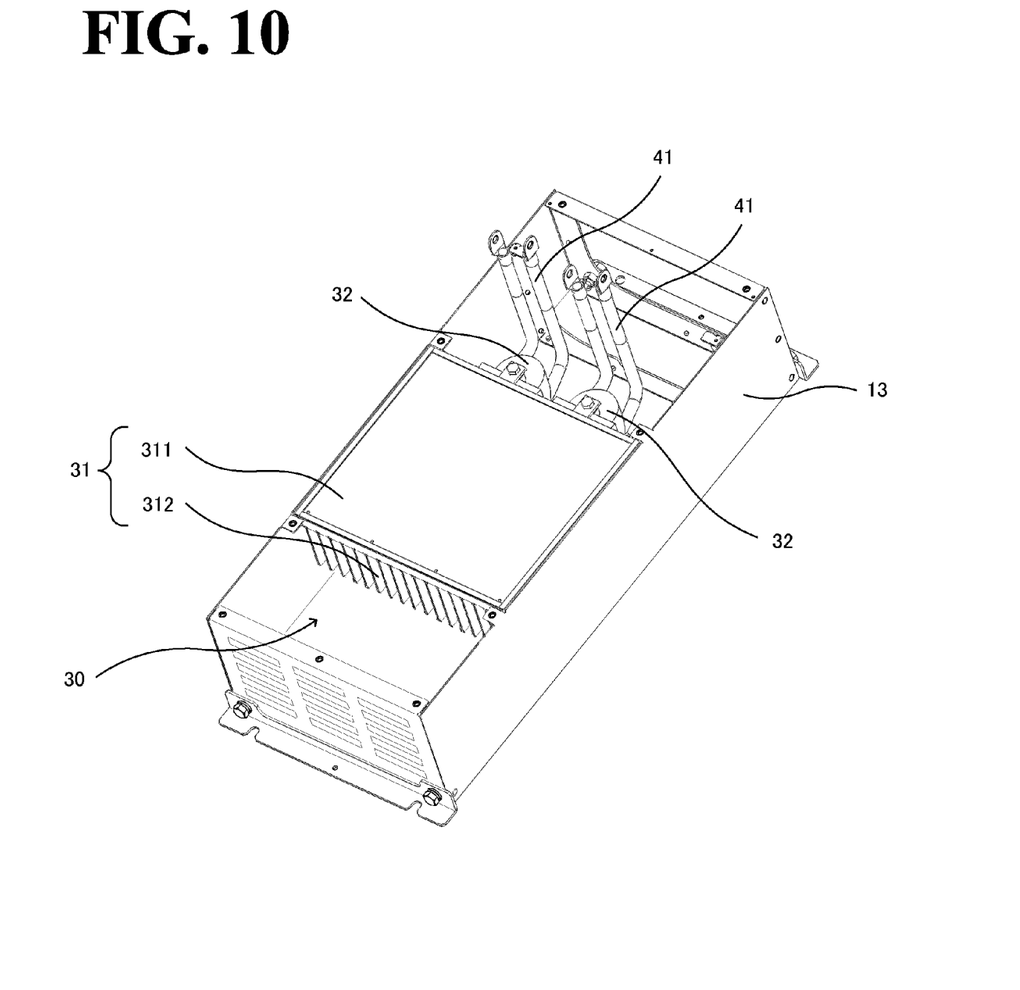
FIG. 10 is a perspective view of the air duct housing piece illustrating its internal structure after mounting of a heat sink.

As shown in FIG. 8, in the air duct housing piece 13, the reactor base 34 is disposed where reactors 32 are to be mounted. On the reactor base 34 shown in FIG. 8, two reactors 32 are mounted, as shown in FIG. 9. As described above, each reactor 32 uses two cables 41 as lead wires, and a total of four cables 41 stand on themselves. As shown in FIG. 10, the heat sink 31 is disposed in the air duct housing piece 13.

Figure 11:
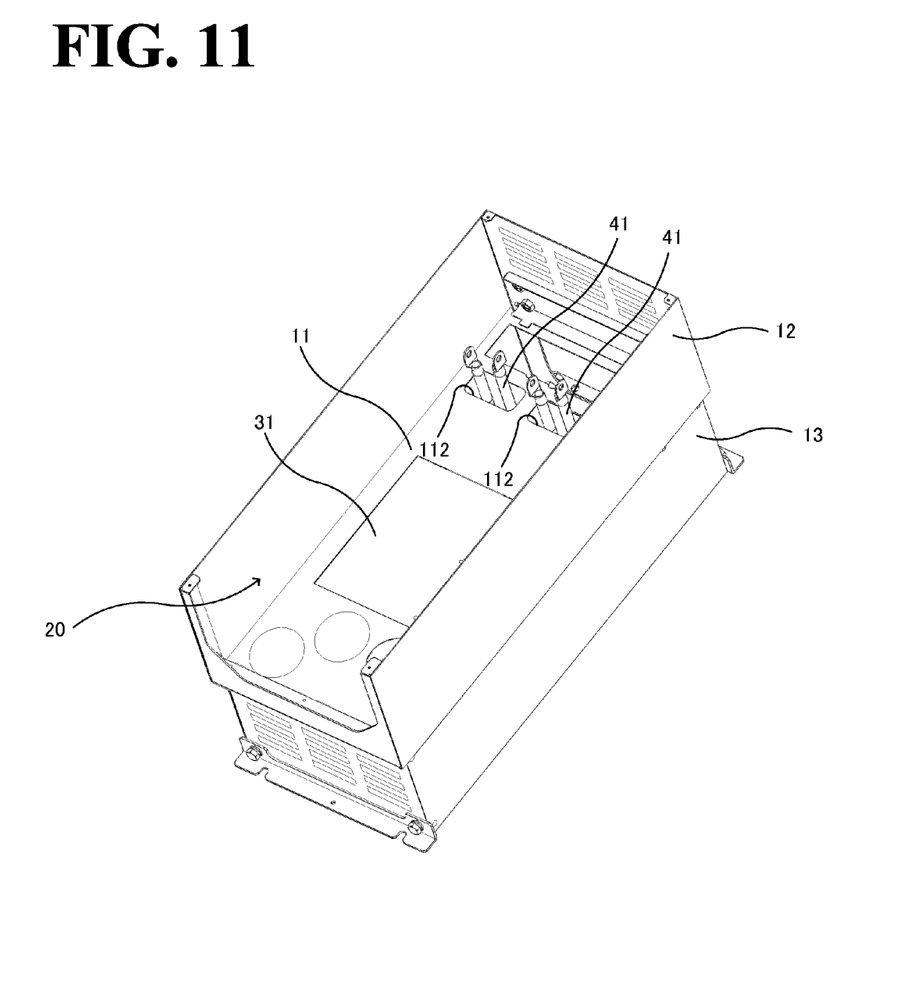
FIG. 11 is a perspective view of the housing with a main body housing piece mounted to the air duct housing piece.

Next, as shown in FIG. 11, the main body housing piece 12 is mounted to the air duct housing piece 13 with the cables 41 inserted through the through hole 112 of the housing base 11. While in this embodiment the heat sink 31 is mounted before the mounting of the main body housing piece 12, the heat sink 31 may be mounted after the mounting of the main body housing piece 12.

Figure 12:
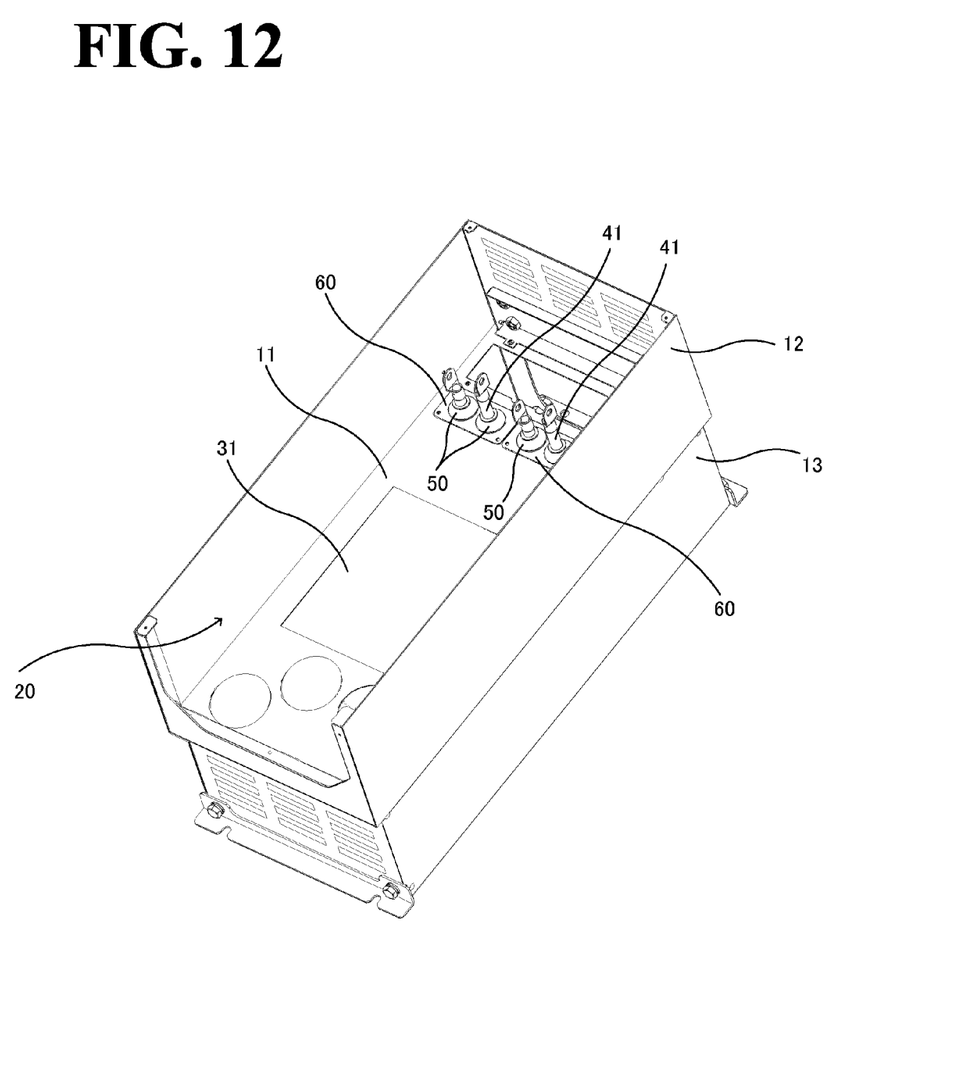
FIG. 12 is a perspective view of the housing after mounting of a grommet securing member.

Then, as shown in FIG. 12, the grommets 50 are mounted to the grommet securing members 60, and the grommet securing members 60 are mounted to the housing base 11 while the cables 41, which are standing on themselves, are inserted through the respective grommets 50. This, as described above, ensures that the edge portion 64 of each grommet securing member 60 is brought into close contact with the housing base 11 across the gasket 65, and that the through hole 112 of the housing base 11 is thereby hermetically sealed.

Thus, in the power converting apparatus 1 according to this embodiment, the cables 41 standing on themselves in the direction approximately orthogonal to the housing base 11 are inserted through the through hole 112, which is disposed on the housing base 11, so as to be wired between the main body 20 and the air duct 30. The grommets 50, through which the cables 41 are inserted, are secured to the through hole 112 of the housing base 11 by the grommet securing member 60. The grommet securing member 60 is disposed in the main body 20 and is not integral with the housing base 11.

The assembly work of the waterproof structure of the cable penetrating portion thus configured is as shown in FIGS. 11 and 12. The main body housing piece 12 is mounted to the air duct housing piece 13 in such a manner that the self-standing cables 41, which stand on themselves in the direction approximately orthogonal to the housing base 11, are inserted through the through hole 112. Then, the grommets 50 are mounted to the grommet securing members 60, and then secured to the through hole 112 of the housing base 11 via the grommet securing members 60 while the cables 41 now protruding from the through hole 112 of the housing base 11 are inserted through the respective grommets 50.

Thus, making the cables 41 for the reactors 32 self-standing cables saves a worker the need to grasp the cables 41. This eliminates or minimizes laborious work involved with usual, non-self-standing cables. For example, with the non-self-standing cables, when the main body housing piece 12, which has approximately the same size as that of the air duct housing piece 13, is mounted to the air duct housing piece 13, in other words, when the opening of the air duct housing piece 13 on the housing base 11 side is covered, the worker would have to reach through the air duct housing piece 13, which is now under the main body housing piece 12, so as to grasp the non-self-standing cables and insert them through the respective grommets 50, which are small in size compared with the housing base 11. Additionally, making the grommet securing members 60 separate entities from the housing base 11 eliminates or minimizes laborious work involved with securing the grommets 50 directly to the through hole 112 of the housing base 11. For example, securing the grommets 50 directly to the through hole 112 necessitates positioning between the cables 41 and the grommets 50 at the time of mounting of the main body housing piece 12, which is large in size compared with the grommets 50. Contrarily, all that is necessary is in this embodiment after mounting the main body housing piece 12 to the air duct housing piece 13 is to fit the grommets 50 and the grommet securing members 60, which are small in size compared with the main body housing piece 12, with the cables 41 now protruding from the through hole 112 of the housing base 11. This improves the assembly workability of the waterproof structure of the cable penetrating portion.

It is particularly noted that in this embodiment, the grommet securing member 60 hermetically seals the through hole 112 of the housing base 11. This ensures a reliable waterproof structure for the through hole 112 of the housing base 11 with the grommets 50 secured by the grommet securing member 60. This in turn eliminates or minimizes intrusion of air, dust, and water droplets into the main body 20 from the air duct 30.

It is particularly noted that in this embodiment, the edge portion 64 of the grommet securing member 60 is in close contact with the circumference of the through hole 112 of the housing base 11. The close contact of the edge portion 64 ensures hermetic sealing of the through hole 112 of the housing base 11. In addition, the gasket 65 is disposed on the edge portion 64 of the grommet securing member 60. This further improves the hermetic sealability of the through hole 112 of the housing base 11 by the grommet securing member 60.

It is particularly noted that in this embodiment, the grommet securing member 60 secures a plurality of grommets 50 (two grommets 50 in the above example). This reduces the number of grommet securing members 60 as compared with a single grommet securing member 60 securing a single grommet 50 (which requires the same number of the grommet securing members 60 as the number of the grommets 50). This in turn reduces the piece-part count and the steps count for assembly. It is particularly noted that in this embodiment, each grommet securing member 60 secures two cables 41 of a corresponding one of the reactors 32. This ensures a clear correspondence between a reactor 32 and a grommet securing member 60, and ensures well organized wiring of the cables 41 in the housing 10.

While in the above-described embodiment the cables 41 serve as lead wires for the reactors 32, the cables 41 may serve any other purposes insofar as the cables 41 are self-standing cables passing through the housing base 11 and are wired between the main body 20 and the air duct 30.

While in the above-described embodiment the grommet securing member 60 is disposed in the main body 20, this should not be construed in a limiting sense. For example, in such assembly work that the air duct housing piece 13 is mounted to the main body housing piece 12 when it is the air duct housing piece 13 that has the housing base 11, disposing the grommet securing member 60 in the air duct 30 provides similar advantageous effects to those in the above-described embodiment.

While in the above-described embodiment two reactors 32 are disposed in the air duct 30, it is also possible to dispose a single reactor 32 or three or more reactors 32. In each case, all that is necessary is to dispose the same number of grommet securing members 60 as the number of the reactors 32.

While in the above-described embodiment each grommet securing member 60 secures two grommets 50, each grommet securing member 60 may secure three or more grommets 50. When a small number of cables are to be wired through the housing base 11, the grommet securing member 60 may secure a single grommet 50.

While in the above-described embodiment the power converting apparatus 1 is an inverter device to convert direct current power into alternating current power, this should not be construed in a limiting sense. The power converting apparatus may be a converter device to convert alternating current power into direct current power.

It will be appreciated that various embodiments and modifications described herein may be readily combined.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A power converting apparatus configured to convert alternating current power into direct current power or convert direct current power into alternating current power, the power converting apparatus comprising:
   a housing comprising:
      a housing base having a first surface and a second surface and comprising a through hole;
      a main body comprising a plurality of electronic components on the first surface of the housing base; and
      an air duct through which cooling air flows on the second surface of the housing base;
   a self-standing cable disposed through the through hole of the housing base so as to be wired between the main body and the air duct, and the self-standing cable standing on itself in a direction approximately orthogonal to the housing base; and a grommet securing member disposed in at least one of the air duct and the main body so as to secure a grommet to the through hole of the housing base, the grommet permitting the self-standing cable to be disposed through the grommet, the grommet securing member being not integral with the housing base.

2. The power converting apparatus according to claim 1, wherein the grommet securing member is configured to hermetically seal the through hole of the housing base.

3. The power converting apparatus according to claim 2, wherein the grommet securing member comprises a flat plate through which the grommet is disposed so as to hold the grommet, the flat plate comprising a close contact portion in close contact with a circumference of the through hole of the housing base.

4. The power converting apparatus according to claim 3, wherein the grommet securing member comprises a gasket disposed on the close contact portion.

5. The power converting apparatus according to claim 1, wherein the grommet securing member configured to secure a plurality of grommets.

6. The power converting apparatus according to claim 1, further comprising a reactor disposed in the air duct,
wherein the self-standing cable comprises a lead wire for the reactor, and
wherein the grommet securing member is disposed in the main body.

7. A reactor disposed in an air duct of a power converting apparatus configured to convert alternating current power into direct current power or convert direct current power into alternating current power,
the power converting apparatus comprising:
a housing comprising:
a housing base having a first surface and a second surface and comprising a through hole;
a main body comprising a plurality of electronic components on the first surface of the housing base; and
the air duct through which cooling air flows on the second surface of the housing base,
the reactor comprising a self-standing cable comprising a lead wire for the reactor, the self-standing cable being disposed through the through hole of the housing base so as to be wired between the main body and the air duct, the self-standing cable standing on itself in a direction approximately orthogonal to the housing base.

8. The power converting apparatus according to claim 2, wherein the grommet securing member configured to secure a plurality of grommets.

9. The power converting apparatus according to claim 3, wherein the grommet securing member configured to secure a plurality of grommets.

10. The power converting apparatus according to claim 4, wherein the grommet securing member configured to secure a plurality of grommets.

11. The power converting apparatus according to claim 2, further comprising a reactor disposed in the air duct,
wherein the self-standing cable comprises a lead wire for the reactor, and
wherein the grommet securing member is disposed in the main body.

12. The power converting apparatus according to claim 3, further comprising a reactor disposed in the air duct,
wherein the self-standing cable comprises a lead wire for the reactor, and
wherein the grommet securing member is disposed in the main body.

13. The power converting apparatus according to claim 4, further comprising a reactor disposed in the air duct,
wherein the self-standing cable comprises a lead wire for the reactor, and
wherein the grommet securing member is disposed in the main body.

14. The power converting apparatus according to claim 5, further comprising a reactor disposed in the air duct,
wherein the self-standing cable comprises a lead wire for the reactor, and
wherein the grommet securing member is disposed in the main body.

15. The power converting apparatus according to claim 8, further comprising a reactor disposed in the air duct,
wherein the self-standing cable comprises a lead wire for the reactor, and
wherein the grommet securing member is disposed in the main body.

16. The power converting apparatus according to claim 9, further comprising a reactor disposed in the air duct,
wherein the self-standing cable comprises a lead wire for the reactor, and
wherein the grommet securing member is disposed in the main body.

17. The power converting apparatus according to claim 10, further comprising a reactor disposed in the air duct,
wherein the self-standing cable comprises a lead wire for the reactor, and
wherein the grommet securing member is disposed in the main body.

* * * * *